(12) United States Patent
Kim

(10) Patent No.: US 10,768,223 B2
(45) Date of Patent: Sep. 8, 2020

(54) SEMICONDUCTOR DEVICE AND MEMORY MODULE INCLUDING THE SEMICONDUCTOR DEVICE

(71) Applicant: SK hynix Inc., Icheon-si Gyeonggi-do (KR)

(72) Inventor: Yong Seop Kim, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 20 days.

(21) Appl. No.: 16/213,771

(22) Filed: Dec. 7, 2018

(65) Prior Publication Data

US 2019/0362804 A1   Nov. 28, 2019

(30) Foreign Application Priority Data

May 23, 2018 (KR) .................... 10-2018-0058128

(51) Int. Cl.
   *G01R 31/28*      (2006.01)
   *G11C 29/56*      (2006.01)
   *G01R 31/3185*    (2006.01)
   *G01R 31/3181*    (2006.01)

(52) U.S. Cl.
   CPC ... *G01R 31/2853* (2013.01); *G01R 31/31813* (2013.01); *G01R 31/318513* (2013.01); *G11C 29/56004* (2013.01); *G11C 29/56008* (2013.01)

(58) Field of Classification Search
   None
   See application file for complete search history.

(56) References Cited

U.S. PATENT DOCUMENTS

| | | | | |
|---|---|---|---|---|
| 3,693,155 A | * | 9/1972 | Crafton | H04B 3/542 340/2.81 |
| 4,320,509 A | * | 3/1982 | Davidson | G06F 11/27 714/37 |
| 7,302,623 B2 | | 11/2007 | Kang | |
| 8,588,017 B2 | | 11/2013 | Park et al. | |
| 10,001,525 B2 | * | 6/2018 | Kang | G11C 29/40 |
| 2006/0048031 A1 | * | 3/2006 | Aadsen | G01R 31/3187 714/733 |
| 2009/0172480 A1 | * | 7/2009 | Jeddeloh | G11C 29/56 714/720 |
| 2011/0292742 A1 | * | 12/2011 | Oh | G11C 29/702 365/189.05 |
| 2012/0324305 A1 | * | 12/2012 | Whetsel | G01R 31/31853 714/733 |
| 2012/0326775 A1 | * | 12/2012 | Heo | G11C 8/12 327/564 |

(Continued)

*Primary Examiner* — Steve N Nguyen
(74) *Attorney, Agent, or Firm* — William Park & Associates Ltd.

(57) ABSTRACT

A semiconductor device may include a plurality of chips and a test pad. The plurality of chips may check parity bits of a plurality of pattern signals activated in units of specific bits and store test result signals generated by the checking of the parity bits. The plurality of chips may output an error detection signal when an error is detected from any of the test result signals. The test pad may output the error detection signal received from the plurality of chips to an external part. The plurality of chips may be commonly coupled to at least one connection line such that, when the error detection signal is output from at least one of the plurality of chips, the outputted error detection signal s output through the test pad.

19 Claims, 9 Drawing Sheets

(56) References Cited

U.S. PATENT DOCUMENTS

| | | | | |
|---|---|---|---|---|
| 2013/0207685 A1* | 8/2013 | Ku | ............... | H01L 22/22 |
| | | | | 324/762.01 |
| 2013/0227344 A1* | 8/2013 | Sohn | ............... | G06F 11/27 |
| | | | | 714/6.21 |
| 2013/0326294 A1* | 12/2013 | Lo | ............... | G11C 29/16 |
| | | | | 714/718 |
| 2014/0110710 A1* | 4/2014 | Gorman | ............... | G11C 29/006 |
| | | | | 257/48 |
| 2014/0347944 A1* | 11/2014 | Lam | ............... | G11C 29/04 |
| | | | | 365/201 |
| 2016/0299190 A1* | 10/2016 | Shim | ............... | G01R 31/31851 |

* cited by examiner

SEMICONDUCTOR DEVICE AND MEMORY MODULE INCLUDING THE SEMICONDUCTOR DEVICE

CROSS-REFERENCE TO RELATED APPLICATION

This application claims priority based upon Korean patent application No. 10-2018-0058128, filed on May 23, 2018, the disclosure of which is hereby incorporated in its entirety by reference herein.

BACKGROUND

1. Technical Field

Embodiments of the present disclosure may generally relate to a semiconductor device and a memory module including the semiconductor device, and a method of operating the semiconductor device, and more particularly, to a technology related to testing a plurality of stacked semiconductor chips.

2. Related Art

Recently, much attention has been paid to a three-dimensional (3D) arrangement technology in which a plurality of chips is stacked to improve the degree of integration of a semiconductor device. The stacked chips may be electrically coupled to each other through a through silicon via (TSV) or wire bonding. Chips included in the semiconductor device may receive addresses, commands, signals for entering a test mode, and signals needed for a test operation through a TSV or wire bonding, and may output signals and data including various kinds of information.

After the semiconductor device based on 3D arrangement technology has been fabricated, a test for testing whether or not the fabricated semiconductor device normally operates is needed. In the case of using a semiconductor device in which a plurality of chips is stacked, defects may occur in a TSV or wire bonding needed to interconnect respective chips.

If a defect occurs in the TSV or wire bonding during a test operation, this means that a defective chip has been encountered. If a defect occurs in the TSV or wire bonding needed to interconnect the chips, it is difficult to correctly recognize the position of the defect. Therefore, it is very important to confirm connectivity of the TSV or wire bonding needed to interconnect the respective chips.

BRIEF SUMMARY

In accordance with an embodiment of the present disclosure, a semiconductor device may include a plurality of chips and a test pad. The plurality of chips may be configured to check parity bits of a plurality of pattern signals activated in units of specific bits and store test result signals generated by the checking of the parity bits, and may be configured to output an error detection signal when an error is detected from any of the test result signals. The test pad may be configured to output the error detection signal received from the plurality of chips to an external part. The plurality of chips may be commonly coupled to at least one connection line such that, when the error detection signal is output from at least one of the plurality of chips, the outputted error detection signal may be output through the test pad.

In accordance with another embodiment of the present disclosure, a memory module may include a controller and a semiconductor device. The controller may be configured to generate a plurality of pattern signals activated in units of specific bits. The semiconductor device may be configured to check parity bits of the plurality of pattern signals and store test result signals generated by the checking of the parity bits, and may be configured to output an error detection signal when an error is detected from any of the test result signals. The semiconductor device may include a plurality of chips commonly coupled to at least one connection line such that, when the error detection signal is output from at least one of the plurality of chips, the outputted error detection signal may be output through a test pad.

BRIEF DESCRIPTION OF THE DRAWINGS

The above and other features and advantages of the present disclosure will become readily apparent by reference to the following detailed description when considered in conjunction with the accompanying drawings wherein.

DETAILED DESCRIPTION

Various embodiments of the present disclosure are directed to providing a semiconductor device and a memory module including the same that may substantially obviate one or more problems due to limitations and disadvantages of the related art.

The embodiments of the present disclosure relate to a semiconductor device that may be used for testing connectivity of a plurality of stacked semiconductor chips.

It is to be understood that both the foregoing general description and the following detailed description of the present disclosure are exemplary and explanatory and are intended to provide further explanation of the disclosure as claimed.

Reference will now be made in detail to embodiments of the present disclosure, examples of which are illustrated in the accompanying drawings. Wherever possible, the same reference numbers are used throughout the drawings to refer to the same or like portions.

Figure 1:
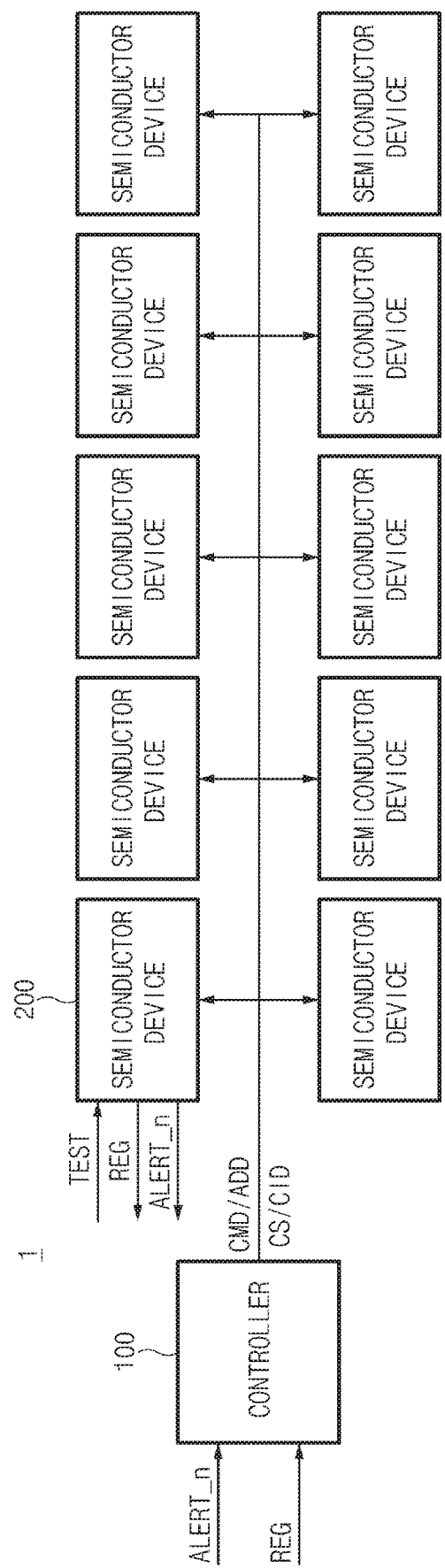
FIG. 1 is a block diagram illustrating an example of a memory module according to an embodiment of the present disclosure.

FIG. 1 is a block diagram illustrating a memory module according to an embodiment of the present disclosure.

Referring to FIG. 1, the memory module 1 may include a controller 100 and a plurality of semiconductor devices 200. As can be seen from FIG. 1, a board of the memory module 1 may include a total of 10 semiconductor devices 200. However, the scope or spirit of the present disclosure is not limited thereto, and the number of semiconductor devices 200 included in the memory module 1 is not limited thereto.

The memory module 1 may store data, that is accessed in response to a request from a host (not shown), in the semiconductor devices 200, and may manage the stored data. The controller 100 may store various information related to operation states, characteristics, throughput parameters, etc. of the semiconductor devices 200 therein, and may control the semiconductor devices by referring to the stored data during a control operation. The controller 100 may perform mapping of data allocated to the semiconductor devices 200, may manage the data, and may update the data according to data characteristics.

For example, during a test mode, the controller 100 according to an embodiment of the present disclosure may generate a command CMD, an address ADD, a chip selection signal CS, and a chip ID signal CID needed to test the semiconductor devices 200, and may transmit the command CMD, the address ADD, the chip selection signal CS, and the chip ID signal CID to each of the semiconductor devices 200. The controller 100 may receive test information (REG) and an error detection signal ALERT_n that correspond to a test result from each of the semiconductor devices 200. If a test signal TEST is activated during the test mode, each semiconductor device 200 may receive the command CMD, the address ADD, the chip selection signal CS, and the chip ID signal CID, and may perform testing using the received signals. Thereafter, each of the semiconductor devices 200 may output the test information REG and the error detection signal ALERT_n that correspond to the test result.

Scaling of the semiconductor device (for example, dynamic random access memory DRAM) is approaching its limit, and the need for high-capacity memories is increasing due to expansion of data cells and the like. As a result, in order to increase the degree of integration of the semiconductor device 200, a three-dimensional stacked (3DS) semiconductor device that may be capable of increasing the integration degree thereof by stacking and packaging a plurality of chips in a single package has recently been developed. The 3DS semiconductor device includes a plurality of chips, such that the 3DS semiconductor device may be configured to identify the respective chips using electrical signals as well as to select a specific chip from among the identified chips.

The 3DS semiconductor device may use a through silicon via (TSV) as a connection line for signal communication between the chips. Instead of using the TSV, the 3DS semiconductor device may also use wire bonding, that is relatively cheaper than the TSV, as the connection line as necessary, such that a plurality of chips may be stacked using the wire bonding acting as the connection line.

Each of the semiconductor devices 200 according to an embodiment of the present disclosure may be implemented as a stacked memory structure in which a plurality of semiconductor chips is stacked and the respective chips are interconnected through a connection line. If each of the semiconductor devices 200 includes stacked chips, a defect may unexpectedly occur in the connection line configured to interconnect the respective chips. As a result, the semiconductor devices 200 according to an embodiment of the present disclosure may receive the command CMD, the address ADD, the chip selection signal CS, and the chip ID signal CID from the controller 100 during the test mode, such that the semiconductor devices 200 may check an error point of the connection line using the received signals.

For example, each of the semiconductor devices 200 may receive a test pattern of the command CMD and/or the address ADD as 2-bit data. The semiconductor device 200 may test a parity bit of 2-bit data, and may thus check an error point of the connection line.

As described above, the memory module 1 according to an embodiment of the present disclosure may be, for example, implemented as a Dual In-line Memory Module (DIMM). However, the scope or spirit of the present disclosure is not limited thereto, and the memory module 1 may also be comprised of an Unbuffered Dual In-line Memory Module (UDIMM), a Registered Dual In-line Memory Module (RDIMM), a Fully Buffered Dual In-line Memory Module (FBDIMM), a Load Reduced Dual In-line Memory Module (LRDIMM), or any other memory modules as necessary.

Figure 2:
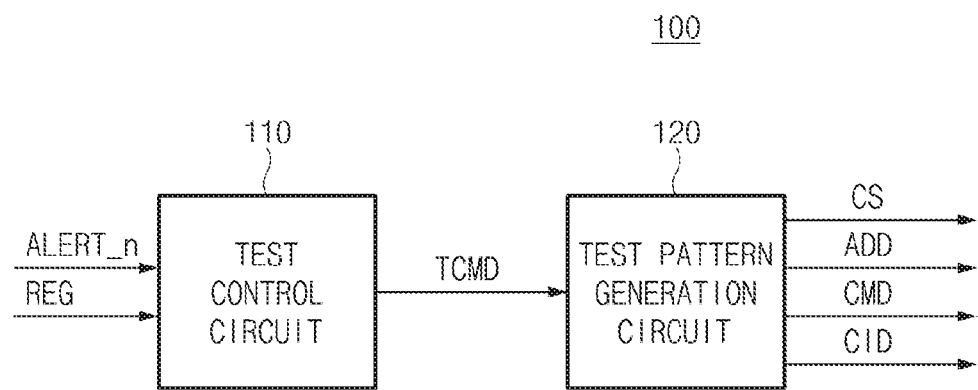
FIG. 2 is a detailed diagram illustrating an example of a controller illustrated in FIG. 1.

FIG. 2 is a detailed diagram illustrating the controller 100 illustrated in FIG. 1 in accordance with an embodiment of the present disclosure.

Referring to FIG. 2, the controller 100 may include a test control circuit 110 and a test pattern generation circuit 120.

The test control circuit 110 may receive test information REG and the error detection signal ALERT_n that correspond to the test result of the semiconductor devices 200. The test control circuit 110 may generate a test command TCMD for testing the presence or absence of a defect of each connection line of the semiconductor devices 200. The test pattern generation circuit 120 may generate a chip selection signal CS, a command CMD, an address ADD, and a chip ID signal CID upon receiving the test command TCMD from the test control circuit 110.

In this case, the chip selection signal CS may activate the plurality of chips included in each of the semiconductor devices 200, such that the command CMD, the address ADD, and the chip ID signal CID can be transmitted to the semiconductor devices 200. The test pattern generation circuit 120 may change and generate a test pattern of the command CMD, the address ADD, and the chip ID signal CID during activation of the test command TCMD. The chip ID signal CID may also be used to read the test result of connectivity (i.e., connectivity test result) of the connection lines of the plurality of chips included in each semiconductor device 200.

For example, the test pattern generation circuit 120 according to an embodiment of the present disclosure may activate the test pattern of the command CMD, the address ADD, and the chip ID signal CID in units of 2 bits (e.g., in units of even bits), may change the activated test pattern in random order, and may output the changed test pattern.

Figure 3:
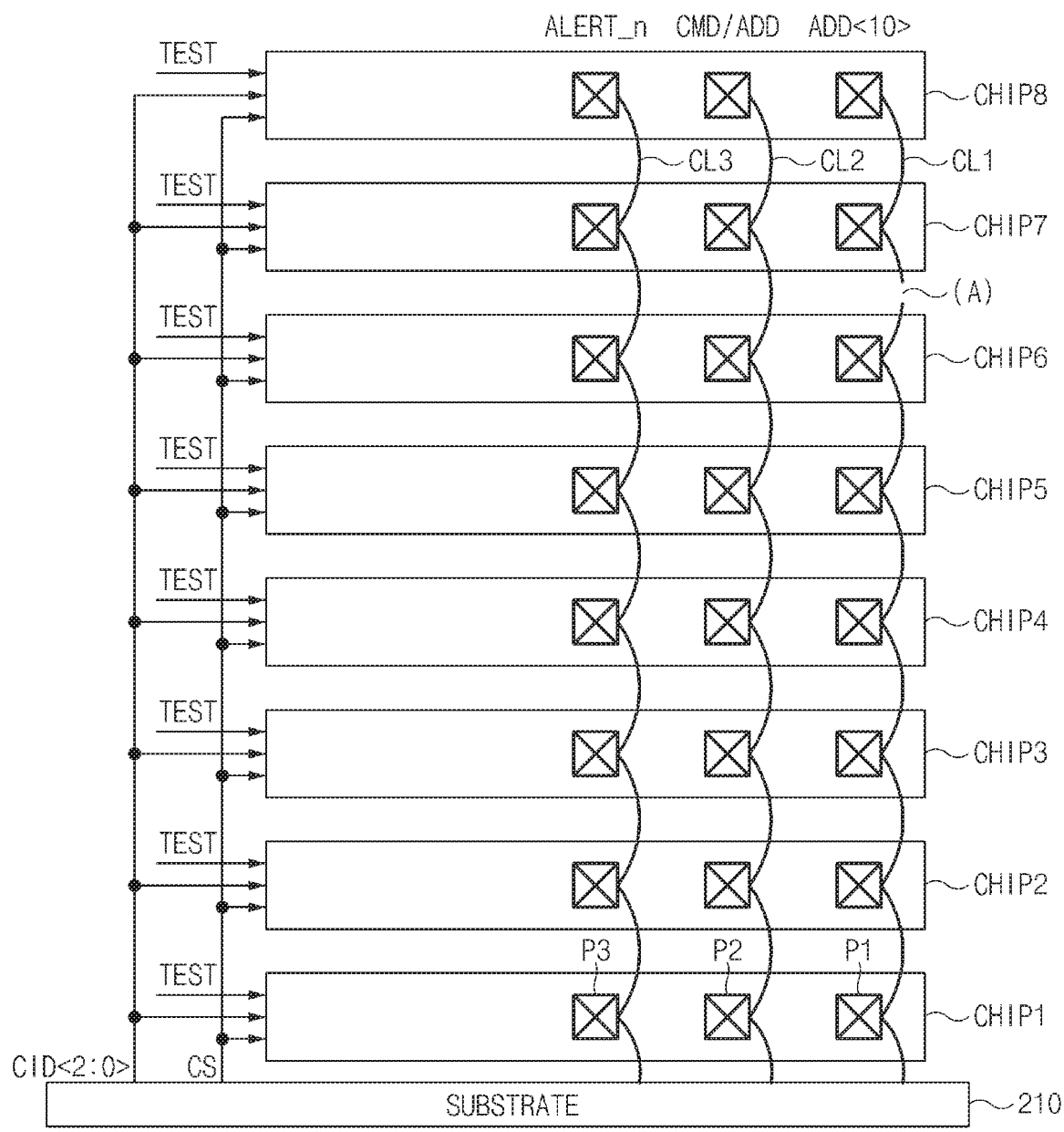
FIG. 3 is a circuit diagram illustrating an example of a structure of each semiconductor device illustrated in FIG. 1.

FIG. 3 is a circuit diagram illustrating each semiconductor device 200 illustrated in FIG. 1 in accordance with an embodiment of the present disclosure.

Referring to FIG. 3, the semiconductor device 200 may include a plurality of chips CHIP1~CHIP8 and a substrate 210. Although FIG. 3 has, as an example, disclosed that each semiconductor device 200 includes 8 chips CHIP1~CHIP8 for convenience of description, the number of chips is not to be limited thereto and can also be changed to another number without departing from the scope or spirit of the present disclosure.

The plurality of chips CHIP1~CHIP8 may be sequentially stacked. A connection line for receiving chip ID signals CID<2:0> may be commonly coupled to the plurality of chips CHIP1~CHIP8. Although the number of chip ID signals CID<2:0> is set to 3 because 8 chips CHIP1~CHIP8 are used in an embodiment of the present disclosure, the number of chip ID signals may also be changed in response to the number of chips. A connection line for receiving the chip selection signal CS may be commonly coupled to the plurality of chips CHIP1~CHIP8. Therefore, the plurality of chips CHIP1~CHIP8 may be simultaneously tested in response to a test signal TEST. Accordingly, in an embodiment, the test results of the respective chips CHIP1~CHIP8 are output in response to at least one chip ID signal CID.

A connection line CL1 for receiving a specific address ADD<10> may be commonly coupled to the plurality of chips CHIP1~CHIP8. A connection line CL2 for receiving the command CMD and the address ADD may be commonly coupled to the plurality of chips CHIP1~CHIP8. In this case, the address ADD applied to the connection line CL2 may correspond to the remaining addresses other than a specific address ADD<10>. A connection line CL3 for outputting the error detection signal ALERT_n may be commonly coupled to the plurality of chips CHIP1~CHIP8. In this case, the error detection signal ALERT_n may be activated when an error is detected from the test result of connectivity (i.e., connectivity test result) of the respective connection lines CL1 and CL2.

The chip CHIP1 located at the lowest position, from among the plurality of chips CHIP1~CHIP8, may be directly coupled to the substrate 210 through the connection lines CL1~CL3. The remaining chips CHIP2~CHIP8 may be electrically coupled to the substrate 210 through the connection lines CL1~CL3. Each of the remaining chips CHIP2~CHIP8 may receive the command CMD, the address ADD, the specific address ADD<10>, and the error detection signal ALERT_n through the connection lines CL1~CL3.

In this case, the chip CHIP1, that is directly coupled to the substrate 210 so as to directly transmit and receive data and signals to and from an external part, may be defined as a master chip. Each of the remaining chips CHIP2~CHIP8 configured to receive data and signals through the master chip may be defined as a slave chip. Although the chip CHIP1 located closest, from among the plurality of chips CHIP1~CHIP8, to the substrate 210 according to an embodiment of the present disclosure is defined as a master chip for convenience of description and better understanding of the present disclosure, the position of the master chip is not limited thereto.

When data and signals are communicated between the controller 100 and the remaining chips CHIP2~CHIP8, the chip CHIP1 coupled to the substrate 210 may relay the data and signals between the controller 1020 and the remaining chips CHIP2~CHIP8. For example, data and signals generated from the chip CHIP2 may be transmitted to the controller 100 after passing through the chip CHIP1, or data and signals received from the controller 100 may be transmitted to the remaining chips CHIP2~CHIP8 after passing through the chip CHIP1.

The connection lines CL1~CL3 for use in each semiconductor device 200 according to an embodiment of the present disclosure may be formed of wire bonding or TSVs. If the connection lines CL1~CL3 are formed of wire bonding, the connection lines CL1~CL3 based on wire bonding may be superior to TSV-based connection lines CL1~CL3 in terms of cost efficiency.

Each of the chips CHIP1~CHIP8 may include a plurality of pads P1~P3 through which the address ADD, the specific address ADD<10>, and the error detection signal ALERT_n are input and output. The pads P1~P3 included in each of the chips CHIP1~CHIP8 may be coupled in series through the connection lines CL1~CL3.

Each of the chips CHIP1~CHIP8 may receive the command CMD, the address ADD, and the specific address ADD<10> from the substrate 210 through its own pads P1 and P2. Each of the chips CHIP1~CHIP8 may transmit the error detection signal ALERT_n to the substrate 210 through its own pad P3. In this case, the pad P3 through which the error detection signal ALERT_n is output will hereinafter be referred to as a test pad for convenience of description and better understanding of the present disclosure.

FIG. 3 has, as an example, disclosed that the connection line CL1 for interconnecting the chip CHIP6 and the chip CHIP7 from among the plurality of chips CHIP1~CHIP8 is cut off as denoted by (A), resulting in occurrence of an unexpected error. If the connection line CL1 is cut off as denoted by (A), the specific address A<10> received from the substrate 210 may not be transmitted to the chips CHIP7 and CHIP8.

In this case, the error detection signal ALERT_n generated from the chip CHIP7 may be output to the substrate 210 through the connection line CL3 and each pad P3. Accordingly, the controller 100 located outside the chips may recognize that errors have occurred in the connection lines CL1 and CL2 of the chip CHIP7.

The pads P3 of the respective chips CHIP1~CHIP8 may be commonly coupled to each other through the connection line CL3. Therefore, although the error detection signals ALERT_n generated from the respective chips CHIP1~CHIP8 are output through the commonly-coupled pads P3 of the respective chips CHIP1~CHIP8, it may be possible to read and confirm an error point for each chip selected by the chip ID signals CID<2.0>. In an embodiment, pad P3 of CHIP1, for example, may be utilized as a test pad for outputting the error detection signal ALERT_n from the plurality of chips CHIP1~CHIP8 to an external part.

Figure 4:
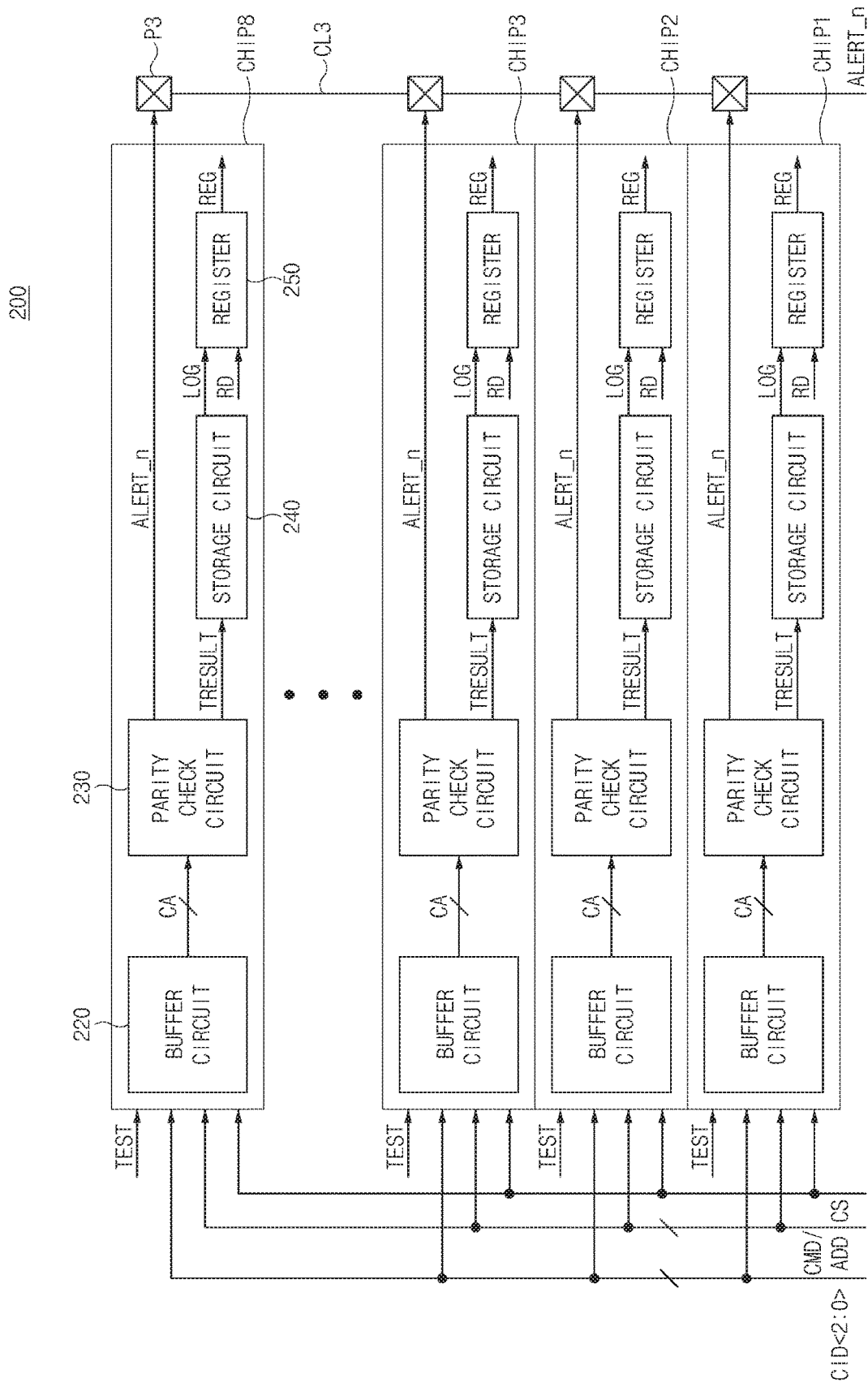
FIG. 4 is a detailed diagram illustrating an example of each semiconductor device illustrated in FIG. 3.

FIG. 4 is a detailed diagram illustrating each semiconductor device 200 illustrated in FIG. 3 in accordance with an embodiment of the present disclosure.

Referring to FIG. 4, the chip ID signals CID<2.0>, the command CMD, the address ADD, the test signal TEST, and the chip selection signal CS may be commonly applied to all the chips CHIP1~CHIP8. Therefore, the plurality of chips CHIP1~CHIP8 may be simultaneously tested. In this case, since the chips CHIP1~CHIP8 may be identical in structure to each other, an embodiment of the present disclosure will hereinafter be described with reference to only a detailed structure of the chip CHIP8 for convenience of description and better understanding of the present disclosure.

The chip CHIP8 may include a buffer circuit 220, a parity check circuit 230, a storage circuit 240, and a register 250.

In the test mode, the buffer circuit 220 may receive the chip ID signals CID<2.0>, the command CMD, the address ADD, and the chip selection signal CS; may buffer the received signals; and may output a buffered signal CA in response to the test signal TEST. In this case, the buffer circuit 220 may recognize all the received command CMD, address ADD, and chip ID signals CID<2.0> as input signals for testing. The command CMD, the address ADD, and the chip ID signals CID<2.0> will hereinafter be generically called a pattern signal CA for convenience of description and better understanding of the present disclosure.

The parity check circuit 230 may perform parity check upon receiving the pattern signal CA, and may output a test result signal TRESULT to the storage circuit 240. When an error is detected from the test result signal TRESULT, the parity check circuit 230 may output the error detection signal ALERT_n to the pad P3. When the parity check circuit 230 outputs the error detection signal ALERT_n to the pad P3, the error detection signal ALERT_N may also be outputted to the other commonly-coupled pads P3 of the semiconductor device 200 through the connection line CL3.

For example, the parity check circuit 230 may check parity bits (for example, 2 bits) of two specific signals from among the pattern signal CA, and may thus output the error detection signal ALERT_n. The parity check circuit 230 may determine the presence or absence of the error detection signal ALERT_n according to logic values of the parity bits.

That is, the parity check circuit 230 may check whether the number of signals each having the value of '1' from among the parity bits of the received pattern signal CA is an even number or an odd number. For example, if each of the parity bits of 2 bits is set to the parity check circuit 230 may determine that no error has occurred, such that the parity check circuit 230 may not activate the error detection signal ALERT_n. For example, if no error has occurred, the error detection signal ALERT_n may be output at a logic high level. On the other hand, if at least one of the parity bits of 2 bits is set to zero '0', the parity check circuit 230 may determine the presence of an error, such that the parity check circuit 230 may activate the error detection signal ALERT_n. For example, if an error has occurred, the error detection signal ALERT_n may be output at a logic low level. In some embodiments, an activated parity bit may have the value of '1' and a deactivated parity bit may have the value of '0'. In other embodiments, an activated parity bit may have the value of '0' and a deactivated parity bit may have the value of '1'.

For convenience of description and better understanding of the present disclosure, an embodiment of the present disclosure has, as an example, disclosed that the parity check circuit 230 may perform error checking by determining whether a logic value (i.e., the number of values of '1') of the parity bits is an even number. However, the scope or spirit of the present disclosure is not limited thereto, and an embodiment of the present disclosure may also perform error checking by determining whether a logic value (i.e., the number of values of '0') of the parity bits is an odd number as necessary. Although an embodiment of the present disclosure has, as an example, disclosed that the parity check circuit 230 may check 2 parity bits that are activated to a high level for convenience of description and better understanding of the present disclosure, the scope or spirit of the present disclosure is not limited thereto, and the parity check circuit 230 may also check 4 parity bits, 6 parity bits, or more parity bits as necessary.

The storage circuit 240 may store the test result signal TRESULT received from the parity check circuit 230, and may output the stored test result signal TRESULT as log information LOG. The register 250 may store log information LOG received from the storage circuit 240. During activation of a read signal RD, the register 250 may output the stored test information REG. In this case, in order to read information stored in the register 250 during activation of the read signal RD, the chip ID signals CID<2.0> may be activated in random order.

In this case, the register 250 may include a multi-purpose register (MPR). The MPR may allow various kinds of information stored in the semiconductor device 200 to be read by an external device. That is, the semiconductor device 200 may be configured to perform testing capable of increasing the accuracy of data, as well as to write and read the data. Therefore, various kinds of information generated by execution of the above testing may be stored in the MPR.

For example, the register 250 according to an embodiment of the present disclosure may store the parity check result of connection lines CL of each chip, and may output the stored information as predetermined pattern data to the external part upon receiving the read signal RD (e.g., the stored information may be outputted to the external part during activation of the read signal RD), Data stored in the register 250 may be output to the external part through an input/output (I/O) pad according to the read signal RD, such that error point information of the connection lines CL for each chip CHIP1~CHIP8 may be confirmed. Information read by the register 250 may be transmitted to an external test device (not shown) through the controller 100. The external test device (not shown) may create statistical data by recognizing the error point information stored in the register 250, such that the external test device may acquire data needed to feed back weak points in the future package fabrication and production processes.

The word "predetermined" as used herein with respect to, such as, predetermined pattern data or time means that a predetermined pattern data or time may be determined prior to being used in a process or algorithm. For some embodiments, the predetermined pattern data or time may be determined before the process or algorithm begins. In other embodiments, the predetermined pattern data or time may be determined during the process or algorithm but before the predetermined pattern data or time is used in the process or algorithm.

Figure 5:
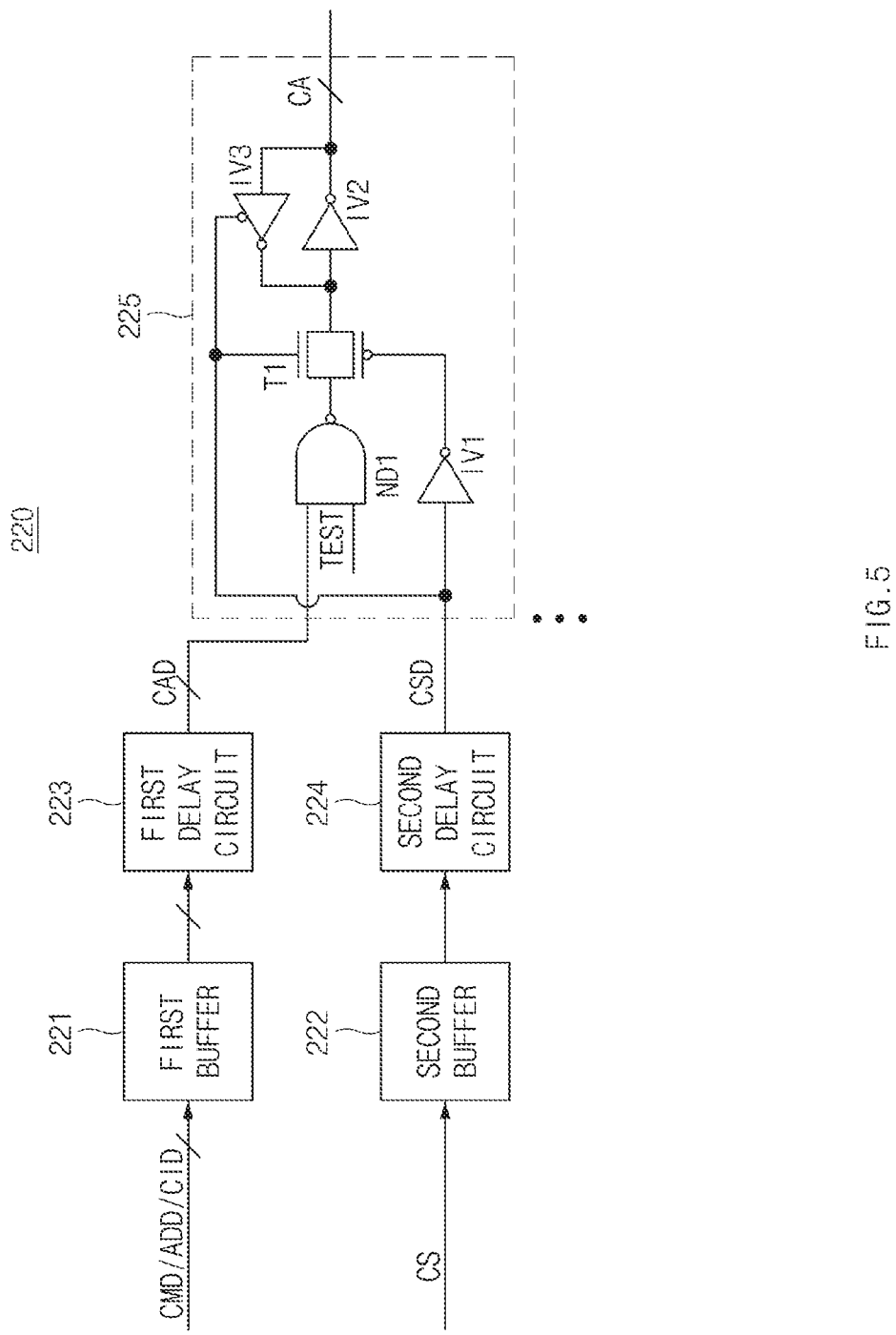
FIG. 5 is a detailed diagram illustrating an example of each buffer circuit illustrated in FIG. 4.

FIG. 5 is a detailed diagram illustrating each buffer circuit 220 illustrated in FIG. 4 in accordance with an embodiment of the present disclosure.

Referring to FIG. 5, each of the buffer circuits 220 may include a first buffer 221, a second buffer 222, a first delay circuit 223, a second delay circuit 224, and a latch circuit 225.

In this case, the first buffer 221 may receive the command CMD, the address ADD, and the chip ID signal CID from the controller 100, and may buffer the received signals CMD, ADD, and CID. The second buffer 222 may buffer the chip selection signal CS received from the controller 100.

The first delay circuit 223 may output a delay signal CAD by delaying an output signal of the first buffer 221. The second delay circuit 224 may output a delay selection signal CSD by delaying an output signal of the second buffer 222.

During activation of the test signal TEST, the latch circuit 225 may latch a delay signal CAD in response to the delay selection signal CSD, and may then output a pattern signal CA. The latch circuit 225 may include a NAND gate ND1, a plurality of inverters IV1~IV3, and a transfer gate T1. In this case, the NAND gate ND1 may perform a NAND operation between the delay signal CAD and the test signal TEST. The transfer gate T1 may selectively output an output signal of the NAND gate ND1 in response to the delay selection signal CSD. The inverters IV2 and IV3 interconnected as a latch structure may output an output signal of the transfer gate T1 upon receiving the delay selection signal CSD, and may then output the pattern signal CA.

Although an embodiment of the present disclosure has, as an example, disclosed only one buffer circuit 220 for convenience of description and better understanding of the present disclosure, the scope or spirit of the present disclosure is not limited thereto, and the number of buffer circuits 220 for use in each chip may be a plural number as necessary. For example, if there is a need to output 26 pattern signals CA, each of the number of first buffers 221, the number of second buffers 222, the number of first delay circuits 223, the number of second delay circuits 224, and the number of latch circuits 225 may be set to a plural number corresponding to the 26 pattern signals CA.

Figure 6:
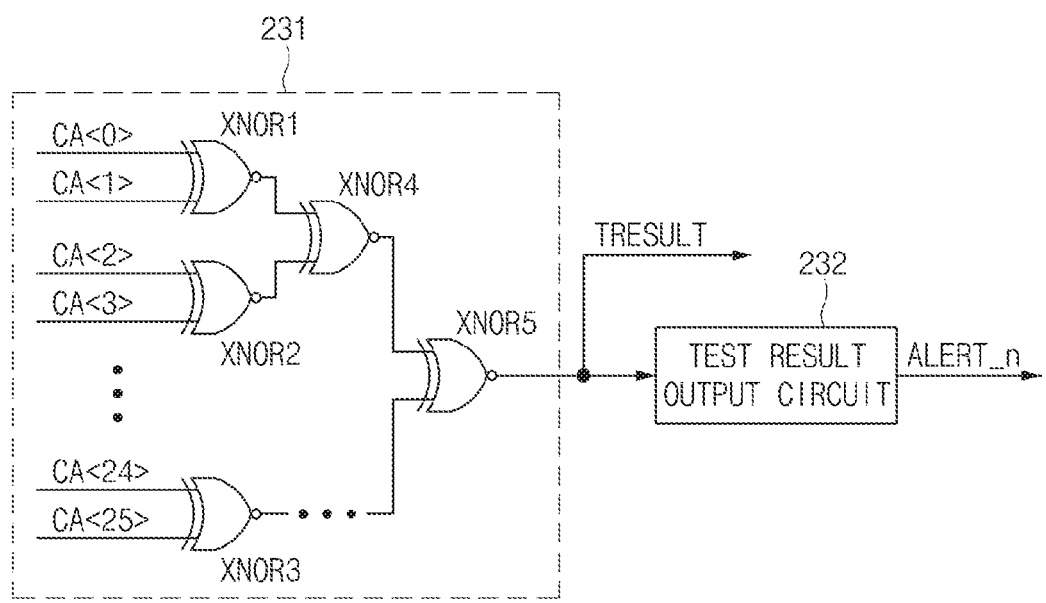
FIG. 6 is a detailed circuit diagram illustrating an example of each parity check circuit illustrated in FIG. 4.

FIG. 6 is a detailed circuit diagram illustrating each parity check circuit 230 illustrated in FIG. 4 in accordance with an embodiment of the present disclosure.

Referring to FIG. 6, each of the parity check circuits 230 may check parity bits of a plurality of pattern signals CA<25:0>, and may thus output the test result signal TRESULT and the error detection signal ALERT_n. The parity check circuit 230 may include a parity circuit 231 and a test result output circuit 232.

The parity circuit 231 may generate and output the test result signal TRESULT by logically combining parity bits of the plurality of pattern signals CA<25:0> (i.e., CA<0>~CA<25>). Although an embodiment of the present disclosure has, as an example, disclosed that the number of pattern signals CA<25:0> is set to 26 for convenience of description, the number of pattern signals is not limited thereto. For example, if the number of pattern signals CA<25:0> is set to 26, the number of each of the constituent elements illustrated in FIG. 5 may be set to 26. In more detail, each of the number of first buffers 221, the number of second buffers 222, the number of first delay circuits 223, the number of second delay circuits 224, and the number of latch circuits 225 may be set to 26.

The parity circuit 231 may check whether the number of signals each having the value of '1' from among the parity bits of the pattern signals CA<25:0> is an even number, and may perform error detection according to the checked result. The parity circuit 231 may include a plurality of XNOR gates XNOR1~XNOR5. In this case, the plurality of XNOR gates XNOR1~XNOR5 may perform XNOR operations between the parity bits of the pattern signals CA<25:0>. For example, if each of the parity bits of the plurality of pattern signals CA<25:0> is set to '1' (i.e., if the number of values of '1' is an even number), the test result signal TRESULT may be output at a logic high level. On the other hand, if at least one of the parity bits of the plurality of pattern signals CA<25:0> is set to '0' (i.e., if the number of values of '1' is an odd number), the test result signal TRESULT may be output at a logic low level.

Upon receiving the test result signal TRESULT having a logic low level, the test result output circuit 232 may determine the presence of an error (e.g., detect an error from the test result signal TRESULT), may activate the error detection signal ALERT_n, and may output the activated error detection signal ALERT_n to the pad P3. The controller 100 may receive the error detection signal ALERT_n from the pad P3, and may thus determine the error check result of the semiconductor device 200.

Figure 7:
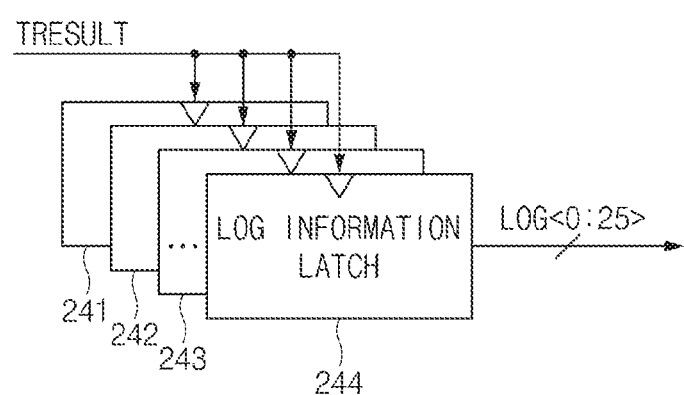
FIG. 7 is a detailed diagram illustrating an example of each storage circuit illustrated in FIG. 4.

FIG. 7 is a detailed diagram illustrating each storage circuit 240 illustrated in FIG. 4 in accordance with an embodiment of the present disclosure.

Referring to FIG. 7, each of the storage circuits 240 may store the test result signal TRESULT received from the parity check circuit 230 in a plurality of log information latches 241~244. In response to the test result signal TRESULT, each of the log information latches 241~244 may store information regarding a defective pattern signal (e.g., an erroneous pattern signal) from among the plurality of pattern signals CA<25:0>. The storage circuit 240 may output a plurality of log information LOG<25:0> to the register 250. In this case, the number of log information LOG<25:0> may be identical to the number of pattern signals CA<25:0>.

Although an embodiment of the present disclosure has, as an example, disclosed that the number of log information LOG<25:0> is set to 26 for convenience of description and better understanding of the present disclosure, the number of log information is not limited thereto, and the number of log information may also be changed to another number according to the number of pattern signals.

Figure 8:
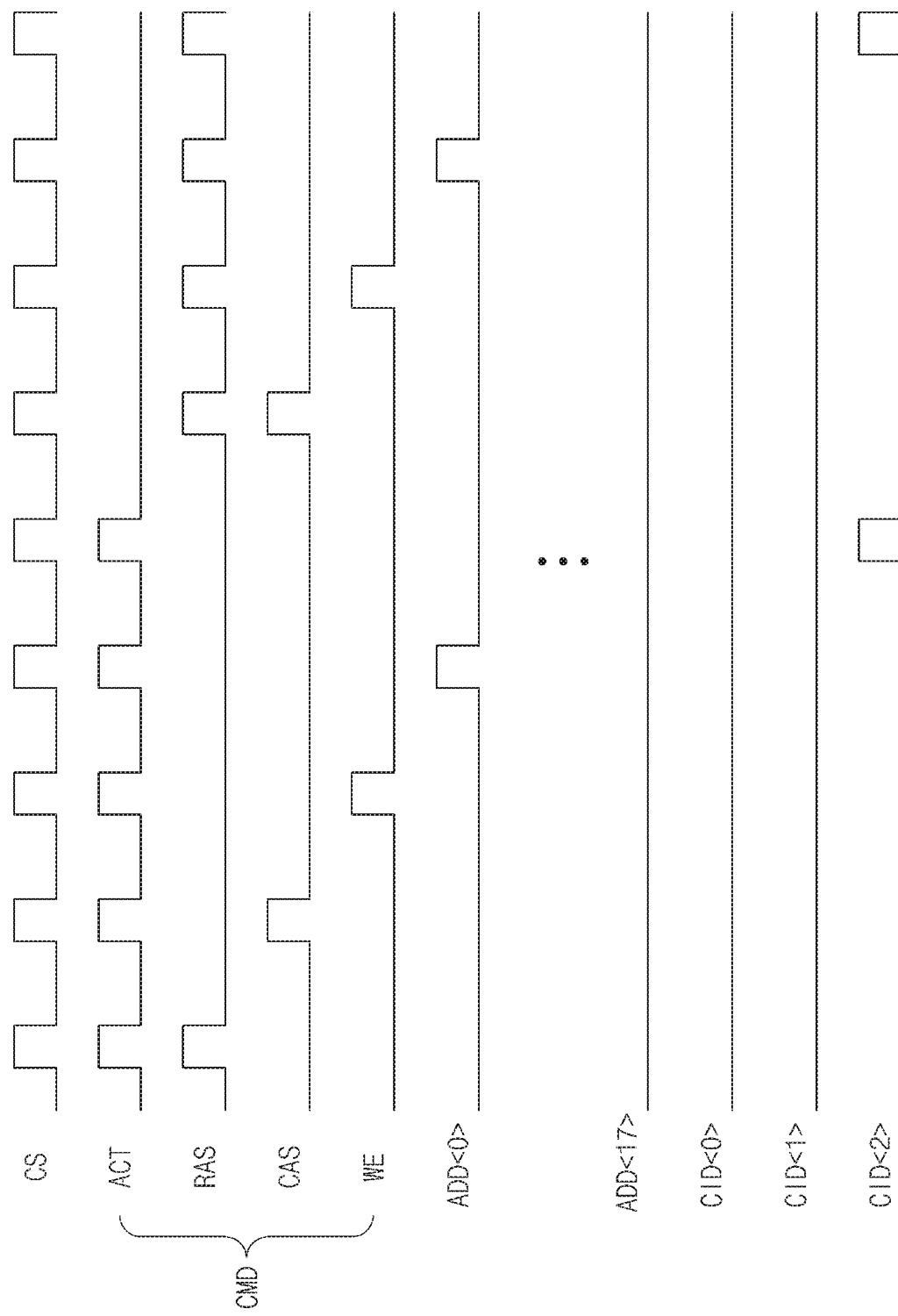
FIG. 8 is a waveform diagram illustrating operations of the controller illustrated in FIG. 2.

FIG. 8 is a waveform diagram illustrating operations of the controller 100 illustrated in FIG. 2 in accordance with an embodiment of the present disclosure.

Referring to FIG. 8, during activation of the test command TCMD, the test pattern generation circuit 120 may start testing, and may activate the chip selection signal CS at intervals of a predetermined time. The test pattern generation circuit 120 may simultaneously activate two specific signals from among the command CMD, the address ADD, and the chip ID signal CID, and may thus generate a test pattern. The test pattern generation circuit 120 may generate the test pattern of the command CMD, the address ADD, and the chip ID signals CID<2.0> by synchronizing with an activation timing point of the chip selection signal CS. Thus, in an embodiment, a plurality of pattern signals may be synchronized with a chip selection signal CS such that the pattern signals are simultaneously activated in units of specific bits (e.g., simultaneously activated 2-bit pattern signals).

As can be seen from FIG. 8, an active signal ACT, a row address strobe (RAS) signal (hereinafter referred to as a RAS signal), a column address strobe (CAS) signal (hereinafter referred to as a CAS signal), and a write enable signal WE may correspond to the command CMD of an embodiment. For convenience of description and better understanding of the present disclosure, an embodiment of the present disclosure may assume that 18 addresses ADD<17:0> (i.e., ADD<0>~ADD<17>) are used as the address ADD. The addresses ADD<17:0> may include a bank group address, a bank address, a normal address, etc.

For example, the test pattern generation circuit 120 may simultaneously activate the active signal ACT and the RAS signal RAS, and may thus generate a test pattern. The test pattern generation circuit 120 may simultaneously activate the active signal ACT and the CAS signal CAS, and may thus generate a test pattern. The test pattern generation circuit 120 may simultaneously activate the active signal ACT and the write enable signal WE, and may thus generate a test pattern. In addition, the test pattern generation circuit 120 may simultaneously activate the active signal ACT and the address ADD<0>, and may thus generate a test pattern. The test pattern generation circuit 120 may simultaneously activate the active signal ACT and the chip ID signal CID<2>, and may thus generate a test pattern.

An embodiment of the present disclosure may generate not only the test patterns illustrated in FIG. 8, but also other test patterns according to various combinations of the command CMD, the address ADD, and the chip ID signals CID<2.0> (i.e., CID<0>~CID<2>).

Figure 9:
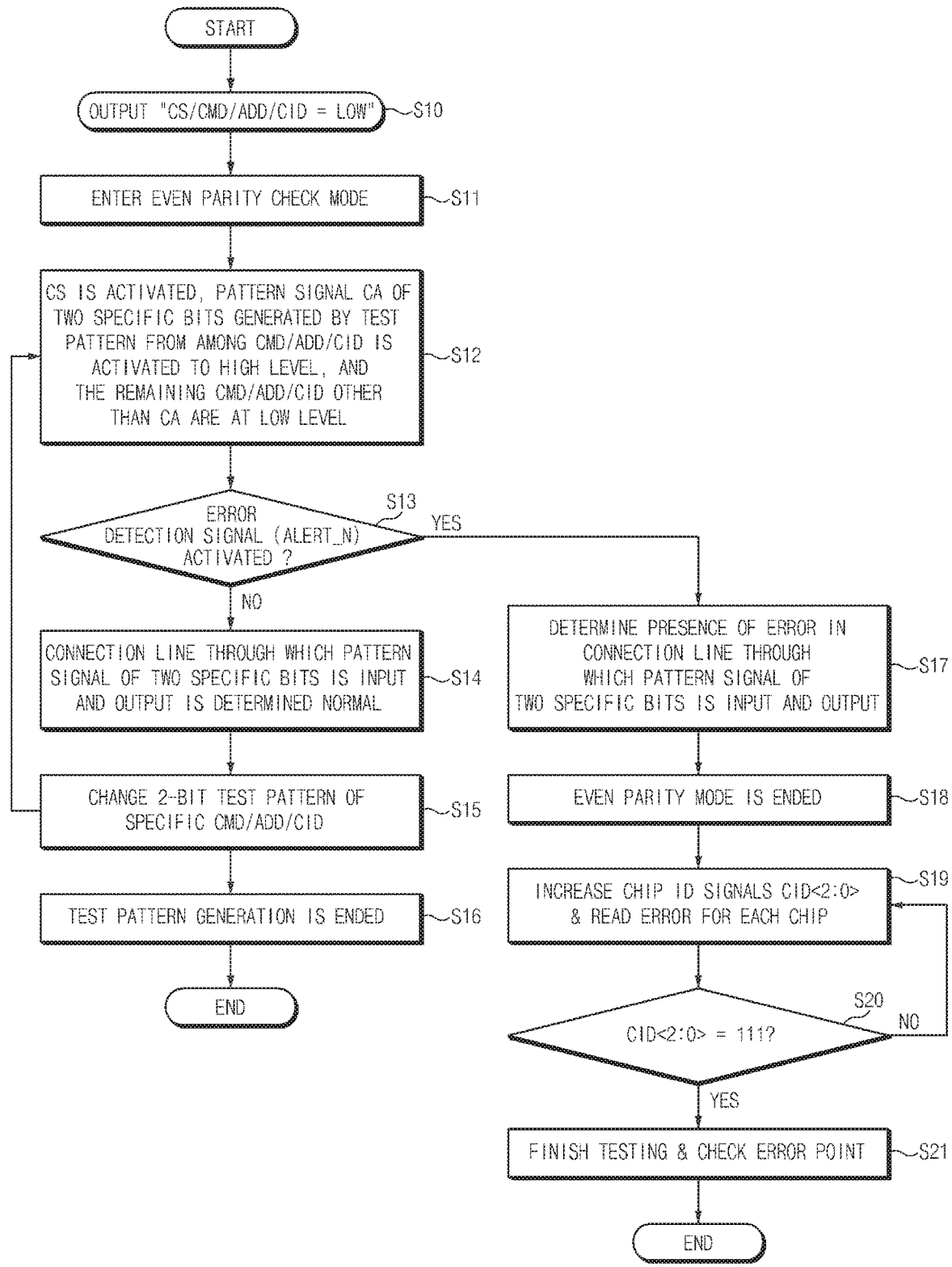
FIG. 9 is a flowchart illustrating operations of each semiconductor device illustrated in FIG. 4.

FIG. 9 is a flowchart illustrating operations of each semiconductor device 200 illustrated in FIG. 4.

Referring to FIG. 9, the test pattern generation circuit 120 may set each of the chip selection signal CS, the command CMD, the address ADD, and the chip ID signal CID to a logic low level, and may then output the resultant signals CS, CMD, ADD, and CID each having a logic low level in step S10. Thereafter, when the test signal TEST is activated, the semiconductor device 200 may enter an even parity check mode in step S11. In this case, the test signal TEST may be activated either by setting of a mode register set (MRS) or by a clock enable signal.

Subsequently, the chip selection signal CS may be activated, and a pattern signal CA having two specific bits generated by the test pattern from among the command CMD, the address ADD, and the chip ID signal CID may be activated to a logic high level. Thereafter, the remaining command CMD, address ADD, and chip ID signal CID other than the pattern signal CA having two specific bits may become a logic low level in step S12. For example, during testing of two addresses ADD<11:10>, the test pattern generation circuit 120 may output the addresses ADD<11:10> at a logic high level, and may output all the remaining command CMD, address ADD, and chip ID signal CID at a logic low level. In an embodiment, the plurality of chips CHIP1~CHIP8 of the semiconductor device 200 may be configured to receive the pattern signal CA having two specific bits generated by the test pattern among the command CMD, the address ADD, and the chip ID signal CID that may be activated to a logic high level. In an embodiment, thereafter, the plurality of chips CHIP1~CHIP8 of the semiconductor device 200 may be configured to receive the remaining command CMD, address ADD, and chip ID signal CID (e.g., the remaining pattern signals) other than the pattern signal CA having two specific bits that may become a logic low level.

If errors of the connection lines CL occur in the respective chips CHIP1~CHIP8, the error detection signal ALERT_n may be output at a low level through the pad P3 in step S13.

If the error detection signal ALERT_n is not activated, it may be determined that the connection lines CL through which the pattern signal CA having two specific bits is input and output are normal in step S14. Therefore, the test pattern of the command CMD, the address ADD, and the chip ID signal CID in association with the pattern signal CA having two specific bits may be changed in step S15. Then, testing may continue again with step S12 with the changed test pattern from step S15. If an error is not detected after testing all the test patterns, no more test patterns may be generated in step S16.

On the other hand, if the error detection signal ALERT_n is activated, it may be determined that an error has occurred in the connection lines CL through which the pattern signal CA having two specific bits is input and output in step S17. If the error detection signal ALERT_n is activated, the test signal TEST may be deactivated such that the even parity mode may be ended in step S18.

Subsequently, if the read signal RD is activated, the chip ID signals CID<2.0> may be changed (for example, the chip ID signals CID<2.0> are increased) such that test information stored in the register 250 may be read and the presence or absence of an error for each chip may be confirmed in step S19. For example, if all the chip ID signals CID<2.0> are at a low level so that logic values (0, 0, 0) are indicated by the chip ID signals CID<2.0>, the test result of the chip CHIP1 may be read. If the chip ID signals CID<2.0> indicate logic values (0, 0, 1), the test result of the chip CHIP2 may be read.

Thereafter, in step S20, it may be determined if bits of the chip ID signals CID<2.0> have been increased to logic values (1, 1, 1) and the error read operation of the last chip (for example, the chip CHIP8) has been completed. If 'YES', the test operation may be ended and the error points may be checked in step S21, If 'NO', the test operation may be continued again at step S19. For example, there is no error in the registers 250 of the chips CHIP1~CHIP6 such that the addresses ADD<11:10> may be output at a logic high level. On the other hand, since there are errors in the chips CHIP7 and CHIP8, the address ADD<11> read from the registers 250 may be output at a logic high level and the remaining address ADD<10> may be output at a logic low level. This means that errors have occurred in the connection line for interconnecting the chip CHIP6 and the other chip CHIP7.

A process for selecting the plurality of chips CHIP1~CHIP8 during the read operation according to an embodiment of the present disclosure will hereinafter be described in detail. The plurality of chips CHIP1~CHIP8 may be selected in random order, and the chip ID signals CID<2.0> according to an embodiment are increased such that the chips CHIP1~CHIP8 may be sequentially selected.

The chip CHIP1 may be activated when the chip ID signals CID<2.0> are set to a first combination (L, L, L). If the chip ID signals CID<2.0> are set to the first combination (L, L, L), this means that the chip ID signal CID<0> is at a logic low level (L), the chip ID signal CID<1> is at a logic low level (L), and the chip ID signal CID<2> is at a logic low level (L). In response to the chip ID signals CID<2.0>, the chip CHIP1 may read the test result of the connection lines CL1~CL3 from the register 250 thereof and may then output the read test result.

The chip CHIP2 may be activated when the chip ID signals CID<2.0> are set to a second combination (L, L, H). If the chip ID signals CID<2.0> are set to the second combination (L, L, H), this means that the chip ID signal CID<0> is at a logic low level (L), the chip ID signal CID<1> is at a logic low level (L), and the chip ID signal CID<2> is at a logic high level (H). In response to the chip ID signals CID<2.0>, the chip CHIP2 may read the test result of the connection lines CL1~CL3 from the register 250 thereof and may then output the read test result.

The chip CHIP3 may be activated when the chip ID signals CID<2.0> are set to a third combination (L, H, L). If the chip ID signals CID<2.0> are set to the third combination (L, H, L), this means that the chip ID signal CID<0> is at a logic low level (L), the chip ID signal CID<1> is at a logic high level (H), and the chip ID signal CID<2> is at a logic low level (L). In response to the chip ID signals CID<2.0>, the chip CHIP3 may read the test result of the connection lines CL1~CL3 from the register 250 thereof and may then output the read test result.

The chip CHIP4 may be activated when the chip ID signals CID<2.0> are set to a fourth combination (L, H, H). If the chip ID signals CID<2.0> are set to the fourth combination (L, H, H), this means that the chip ID signal CID<0> is at a logic low level (L), the chip ID signal CID<1> is at a logic high level (H), and the chip ID signal CID<2> is at a logic high level (H). In response to the chip ID signals CID<2.0>, the chip CHIP4 may read the test result of the connection lines CL1~CL3 from the register 250 thereof and may then output the read test result.

The chip CHIP4 may be activated when the chip ID signals CID<2.0> are set to a fifth combination (H, L, L). If the chip ID signals CID<2.0> are set to the fifth combination (H, L, L), this means that the chip ID signal CID<0> is at a logic high level (H), the chip ID signal CID<1> is at a logic low level (L), and the chip ID signal CID<2> is at a logic low level (L). In response to the chip ID signals CID<2.0>, the chip CHIP5 may read the test result of the connection lines CL1~CL3 from the register 250 thereof and may then output the read test result.

The chip CHIP6 may be activated when the chip ID signals CID<2.0> are set to a sixth combination (H, L, H). If the chip ID signals CID<2.0> are set to the sixth combination (H, L, H), this means that the chip ID signal CID<0> is at a logic high level (H), the chip ID signal CID<1> is at a logic low level (L), and the chip ID signal CID<2> is at a logic high level (H). In response to the chip ID signals CID<2.0>, the chip CHIP6 may read the test result of the connection lines CL1~CL3 from the register 250 thereof and may then output the read test result.

The chip CHIP7 may be activated when the chip ID signals CID<2.0> are set to a seventh combination (H, H, L). If the chip ID signals CID<2.0> are set to the seventh combination (H, H, L), this means that the chip ID signal CID<0> is at a logic high level (H), the chip ID signal CID<1> is at a logic high level (H), and the chip ID signal CID<2> is at a logic low level (L). In response to the chip ID signals CID<2.0>, the chip CHIP7 may read the test result of the connection lines CL1~CL3 from the register 250 thereof and may then output the read test result.

The chip CHIP8 may be activated when the chip ID signals CID<2.0> are set to an eighth combination (H, H, H). If the chip ID signals CID<2.0> are set to the eighth combination (H, H, H), this means that the chip ID signal CID<0> is at a logic high level (H), the chip ID signal CID<1> is at a logic high level (H), and the chip ID signal CID<2> is at a logic high level (H). In response to the chip ID signals CID<2.0>, the chip CHIP8 may read the test result of the connection lines CL1~CL3 from the register 250 thereof and may then output the read test result.

As is apparent from the above description, the semiconductor device and the memory module including the same according to various embodiments of the present disclosure may test connectivity of a plurality of stacked semiconductor chips, resulting in increased reliability of the semiconductor chips.

Those skilled in the art will appreciate that embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor device comprising:
    a plurality of chips configured to check parity bits of a plurality of pattern signals and store test result signals generated by the checking of the parity bits, and configured to output an error detection signal when an error is detected from any of the test result signals; and
    a test pad configured to output the error detection signal received from the plurality of chips to an external part, wherein the plurality of chips is commonly coupled to at least one connection line such that, when the error detection signal is output from at least one of the plurality of chips, the outputted error detection signal is output through the test pad,
    wherein the plurality of pattern signals include a predetermined number of activated bits,
    wherein each of the plurality of chips includes:
        a buffer circuit configured to buffer a command, an address, at least one chip ID signal, and a chip selection signal, and configured to output the plurality of pattern signals in response to a test signal;
        a parity check circuit configured to output the test result signals and the error detection signal by checking parity bits of the plurality of pattern signals;
        a storage circuit configured to store the test result signals therein; and
        a register configured to store an output signal of the storage circuit, and output stored test information to an external part during a read operation.

2. The semiconductor device according to claim 1, wherein the error detection signal is output in response to a result of testing connectivity of the connection line.

3. The semiconductor device according to claim 1, wherein the plurality of chips is configured to receive a first portion of the address through a first connection line that is commonly connected, and configured to receive the command and a remaining portion of the address other than the first portion of the address through a second connection line that is commonly connected.

4. The semiconductor device according to claim 1, wherein the plurality of chips is configured to commonly receive the at least one chip ID signal, the test signal, and the chip selection signal.

5. The semiconductor device according to claim 1, wherein the plurality of chips is configured to determine the presence or absence of an error by checking whether the number of activated parity bits from among the plurality of pattern signals is an even number.

6. The semiconductor device according to claim 1, wherein the buffer circuit includes:
    a first buffer configured to buffer the command, the address, and the at least one chip ID signal;
    a second buffer configured to buffer the chip selection signal;
    a first delay circuit configured to output a delay signal by delaying an output signal of the first buffer;
    a second delay circuit configured to output a delay selection signal by delaying an output signal of the second buffer; and
    a latch circuit configured to latch the delay signal in response to the delay selection signal during activation of the test signal, and output the plurality of pattern signals.

7. The semiconductor device according to claim 1, wherein the parity check circuit is configured to detect the error by checking whether the number of logic values of "1" from among parity bits of the plurality of pattern signals is an even number.

8. The semiconductor device according to claim 1, wherein the parity check circuit includes:
    a parity circuit configured to output the test result signals by logically combining parity bits of the plurality of pattern signals; and a test result output circuit configured to activate the error detection signal when the error is detected from the test result signals, and output the activated error detection signal.

9. The semiconductor device according to claim 1, wherein the storage circuit includes:
a plurality of log information latches configured to store information regarding an erroneous pattern signal from among the plurality of pattern signals in response to the test result signals.

10. The semiconductor device according to claim 1, wherein the register is configured to store information regarding the test result signals, and include a multi-purpose register (MPR) that outputs the stored information as predetermined pattern data during activation of a read signal.

11. The semiconductor device according to claim 1, wherein the plurality of chips is configured in a manner that a test result from the register for each chip is output in response to at least one chip ID signal during a read operation.

12. The semiconductor device according to claim 1, wherein the plurality of pattern signals is generated by the command, the address, and the at least one chip ID signal,
wherein the command, the address, and the at least one chip ID signal include an even number of activated bits.

13. The semiconductor device according to claim 1, wherein the plurality of pattern signals is synchronized with a chip selection signal such that the pattern signals include the predetermined number of simultaneously activated bits.

14. The semiconductor device according to claim 1, wherein the plurality of chips is configured to receive the pattern signal including the predetermined number of activated bits as a first logic level, and receive the remaining pattern signals other than the received pattern signal as a second logic level.

15. The semiconductor device according to claim 1,
wherein patterns of the plurality of pattern signals change according to a combination of any two signals from among the command, the address, and the at least one chip ID signal, and wherein the plurality of pattern signals are received by the plurality of chips.

16. The semiconductor device according to claim 1, wherein the connection line includes any one of a through silicon via (TSV) and wire bonding.

17. A memory module comprising:
a controller configured to generate a plurality of pattern signals include a predetermined number of activated bits; and
a semiconductor device configured to check parity bits of a plurality of pattern signals and store test result signals generated by the checking of the parity bits, and configured to output an error detection signal when an error is detected from any of the test result signals,
wherein the semiconductor device includes a plurality of chips commonly coupled to at least one connection line such that, when the error detection signal is output from at least one of the plurality of chips, the outputted error detection signal is output through a test pad,
wherein each of the plurality of chips includes:
a buffer circuit configured to buffer a command, an address, at least one chip ID signal, and a chip selection signal, and configured to output the plurality of pattern signals in response to a test signal;
a parity check circuit configured to output the test result signals and the error detection signal by checking parity bits of the plurality of pattern signals;
a storage circuit configured to store the test result signals therein; and
a register configured to store an output signal of the storage circuit, and output stored test information to an external part during a read operation.

18. The memory module according to claim 17, wherein the controller includes:
a test control circuit configured to generate a test command for testing a defect of each connection line of the semiconductor device; and
a test pattern generation circuit configured to change the plurality of pattern signals in response to the test command, and output the changed pattern signals.

19. The memory module according to claim 17, wherein the plurality of chips is simultaneously tested by a test signal such that test results of the respective chips are output in response to at least one chip ID signal.

* * * * *